United States Patent
Yang

[11] Patent Number: 6,130,127
[45] Date of Patent: Oct. 10, 2000

[54] METHOD FOR MAKING DYNAMIC RANDOM ACCESS MEMORY CELLS HAVING CACTUS-SHAPED STACKED CAPACITORS WITH INCREASED CAPACITANCE

[75] Inventor: Fu-Liang Yang, Tainan, Taiwan

[73] Assignee: Vanguard International Semiconductor Corporation, Hsin-Chu, Taiwan

[21] Appl. No.: 09/360,122

[22] Filed: Jul. 23, 1999

[51] Int. Cl.[7] ............................................... H01L 21/8242
[52] U.S. Cl. ............................................... 438/253
[58] Field of Search ................... 438/253–256, 438/393–399

[56] References Cited

U.S. PATENT DOCUMENTS

| | | | |
|---|---|---|---|
| 5,399,518 | 3/1995 | Sim et al. | 437/52 |
| 5,543,345 | 8/1996 | Liaw et al. | 437/52 |
| 5,545,585 | 8/1996 | Wang et al. | 438/253 |
| 5,604,146 | 2/1997 | Tseng | 437/52 |
| 5,643,819 | 7/1997 | Tseng | 437/60 |
| 5,770,499 | 6/1998 | Kwok et al. | 438/253 |

Primary Examiner—Jey Tsai
Attorney, Agent, or Firm—George O. Saile; Stephen B. Ackerman

[57] ABSTRACT

An array of DRAM cells having cactus-shaped stacked capacitors with increased capacitance is achieved. A first planar insulating layer is formed, and a silicon nitride ($Si_3N_4$) layer having openings over the FET source/drain areas for node contacts is formed. A thick third insulating layer is deposited and etched to form recesses over the openings for the bottom electrodes, and node contact openings are concurrently etched in the first insulating layer using the $Si_3N_4$ as an etch-stop mask. A first polysilicon layer is deposited to fill the node contact openings and to conformally coat the recesses. A series of layers composed of a fourth insulating, a second polysilicon, and a fifth insulating layer is deposited, while retaining an opening in the recess. The layers in the series are sequentially etched back and then a third polysilicon layer is deposited and chem/mech polished back to the third insulating layer. The exposed insulating layers are then isotropically removed selectively to the $Si_3N_4$ layer to form cactus-shaped capacitor bottom electrodes. The DRAM capacitors are then completed by forming an interelectrode dielectric layer and patterning a fourth polysilicon layer to form the top electrodes.

24 Claims, 5 Drawing Sheets

METHOD FOR MAKING DYNAMIC RANDOM ACCESS MEMORY CELLS HAVING CACTUS-SHAPED STACKED CAPACITORS WITH INCREASED CAPACITANCE

BACKGROUND OF THE INVENTION (1) Field of the Invention

The present invention relates to semiconductor integrated circuits, and more particularly to a method for fabricating an array of dynamic random access memory (DRAM) cells with cactus-shaped stacked capacitors to increase the capacitance while maintaining a high density of memory cells.

(2) Description of the Prior Art

Dynamic random access memory (DRAM) circuits (devices) are extensively used in the electronics industry, and more particularly in the computer industry for storing data in binary form (1 and 0) as charge on a storage capacitor. These DRAM devices are made on semiconductor substrates (or wafers) and then the substrates are diced to form the individual DRAM circuits (or DRAM chips). Each DRAM circuit (chip) consists in part of an array of individual DRAM storage cells that store binary data (bits) as electrical charge on a storage capacitor. Further, the information is stored and retrieved from the storage capacitor by means of switching on or off a single access transistor (via word lines) in each memory cell using peripheral address circuits, while the charge is stored on the capacitor or sensed via bit lines and by read/write circuits formed on the periphery of the DRAM chip.

The access transistor for the DRAM device is usually a field effect transistor (FET), and the single capacitor in each cell is either formed in the semiconductor substrate as a trench capacitor, or built over the FET in the cell area as a stacked capacitor. To maintain a reasonable DRAM chip size and improved circuit performance, it is necessary to further reduce the area occupied by the individual cells on the DRAM chip. Unfortunately, as the cell size decreases, it becomes increasing more difficult to fabricate stacked or trench storage capacitors with sufficient capacitance to store the necessary charge to provide an acceptable signal-to-noise level for the read circuits (sense amplifiers) to detect. The reduced charge also requires more frequent refresh cycles that periodically restore the charge on these volatile storage cells. This increase in refresh cycles further reduces the performance (speed) of the DRAM circuit.

Since the capacitor area is limited to the cell size in order to accommodate the multitude of cells on the DRAM chip, it is necessary to explore alternative methods for increasing the capacitance without increasing the lateral area that the capacitor occupies on the substrate surface. In recent years the method of choice is to build stacked capacitors over the access transistors within each cell area, rather than forming trench capacitors which need to be etched to increasing depths in the substrate to maintain the necessary capacitance. The stacked capacitors also provide increased latitude in capacitor design and processing while reducing cell area. More specifically, the stacked capacitors can be extended in the vertical direction (third dimension) to increase the stacked capacitor area, and therefore to increase the capacitance.

Numerous methods of making DRAM circuits using stacked capacitors have been reported in the literature. One method of making fork-shaped stacked capacitors using sidewall spacers is described by Tseng in U.S. Pat. No. 5,643,819. Another approach for making multiple-walled capacitors using sidewall spacers as an etch mask for etching the multi-walled structure for the bottom electrodes is taught by Sim et al. in U.S. Pat. No. 5,399,518. Still another approach is taught by Liaw et al. in U.S. Pat. No. 5,543,345, in which sidewall spacers are used as an etch mask to form a crown-shaped capacitor. Another method for making stacked capacitors having E-shaped capacitor bottom electrodes is taught by Tseng in U.S. Pat. No. 5,604,146.

Although there has been considerable work done to increase the capacitance area on these miniature stacked capacitors, it is still desirable to further improve on these capacitors while maintaining a simple process using self-aligning techniques to minimize the number of masking steps.

SUMMARY OF THE INVENTION

Accordingly, it is a principal object of the present invention to provide DRAMs with cactus-shaped capacitors having increased capacitance.

Another object of this invention is to form these cactus-shaped capacitors using a single photoresist mask and etch-back techniques to form the bottom electrodes, which provides a cost-effective manufacturing process.

The method for making these DRAM devices with cactus-shaped stacked capacitors with increased capacitance begins by providing a semiconductor substrate. Typically the substrate is a single-crystal silicon substrate doped with a P type conductive dopant, such as boron (B). A relatively thick Field OXide (FOX) is formed surrounding and electrically isolating each device area. The field oxide is typically formed using the LOCal Oxidation of Silicon (LOCOS) method, in which a patterned silicon nitride ($Si_3N_4$) layer is used to mask the device areas from oxidation while the silicon substrate in the FOX areas is thermally oxidized to the desired thickness. Other field oxide isolations can also be used, such as shallow trench isolation (STI) and the like. A thin gate oxide is then formed in the device areas of the silicon substrate for the FETs. Then a polycide (polysilicon/silicide) layer, having a cap oxide ($SiO_2$) thereon, is patterned to form the FET gate electrodes and the interconnecting word lines for the array of memory cells on the DRAM device. Typically for DRAM memory cells the access transistor in each memory cell is an N-channel FET. Next, lightly doped source/drain regions, self-aligned to the FET gate electrodes, are formed by ion implantation. A spacer silicon oxide ($SiO_2$) layer is deposited and anisotropically etched back to form spacers on the sidewalls of the gate electrodes. Source/drain contact regions are formed next in the device areas adjacent to the insulating sidewall spacers by a second ion implantation to complete the FETs in each of the memory cells.

Continuing, a first insulating layer is deposited over the device areas and the field oxide areas. The first insulating layer is composed of silicon oxide ($SiO_2$) and deposited by low-pressure chemical vapor deposition (LPCVD). The first insulating layer is then planarized, for example by chemical/mechanical polishing (CMP). A second insulating layer, composed of silicon nitride ($Si_3N_4$) is deposited by LPCVD on the first insulating layer. Conventional photolithographic techniques and plasma etching are used to form openings in the second insulating layer to the first insulating layer over the device areas where electrical contacts are desired for the array of stacked capacitors.

The array of cactus-shaped stacked capacitors, one in each memory cell area, is now formed by depositing a disposable third insulating layer on the $Si_3N_4$ second insulating layer. A patterned photoresist mask and selective anisotropic plasma etching are used to remove portions of the third insulating layer over the openings in the second insulating layer to form recesses with vertical sidewalls in which the bottom electrodes of the stacked capacitors are to be formed. Using the $Si_3N_4$ second insulating layer as an etching mask, the plasma etching is continued to form contact openings in the first insulating layer to one of the source/drain contact areas of each FET. A conformal conductively doped first polysilicon layer is deposited over the patterned third insulating layer and fills the contact openings in the first insulating layer to make electrical contact with the source/drain device region in each device area. Next a series of conformal layers consisting of a fourth insulating layer, a second polysilicon layer, and a fifth insulating layer is deposited while retaining a center opening in the recesses of the third insulating layer. The fourth and fifth insulating layers are preferably composed of $SiO_2$ and can be deposited by LPCVD, while the second polysilicon layer is conductively doped in situ during deposition, and can be deposited by LPCVD. The fifth insulating is now anisotropically blanket etched back to the second polysilicon layer and is concurrently etched in the bottom of the center opening in each recess while retaining a sidewall spacer. Next, the second polysilicon layer is anisotropically blanket etched back to the fourth insulating layer and is concurrently etched in the bottom of the center opening in the recessed areas. Then the fourth insulating layer is anisotropically blanket etched back to the first polysilicon layer and is also etched in the center opening of the recessed areas. An in-situ conductively doped third polysilicon layer is deposited having a thickness sufficient to fill completely the center openings in the recessed areas to electrically contact the first and second polysilicon layers in the center opening. For example, the third polysilicon layer can be deposited by LPCVD. The third and first polysilicon layers are then chemical/mechanically polished back to the third insulating layer. The remaining third, fourth, and fifth insulating layers are isotropically and selectively removed using a hydrofluoric (HF) acid solution, while the $Si_3N_4$ second insulating layer serves as an etch-stop layer. This results in an array of freestanding bottom electrodes for the cactus-shaped stacked capacitors. The array of capacitors is now completed by forming a thin interelectrode dielectric layer having a high dielectric constant on the bottom electrodes. For example, the dielectric layer can be composed of a $SiO_2/Si_3N_4/SiO_2$ layer (ONO) or other high dielectric constant material such as tantalum pentoxide ($TaO_5$) and the like. A conformal, in-situ doped fourth polysilicon layer is deposited, for example by LPCVD, and is patterned to form the top electrodes to complete the array of dynamic random access memory (DRAM) cells having these novel cactus-shaped stacked capacitors having increased capacitance.

BRIEF DESCRIPTION OF THE DRAWINGS

The objects and advantages of this invention are best understood with reference to the attached drawings in FIGS. 1 through 11, and the embodiment that follows.

DESCRIPTION OF THE PREFERRED EMBODIMENT

The method for making the DRAM cells having these improved cactus-shaped capacitors is now described in detail. However, it should also be well understood by one skilled in the art that by including additional process steps, in addition to those described in this embodiment, other types of devices can also be included on the DRAM chip. For example, by forming N-well regions in a P doped substrate, P-channel FETs can also be provided from which Complementary Metal-Oxide-Semiconductor (CMOS) circuits can also be formed, such as are used for the peripheral circuits on the DRAM chip.

Figure 1:
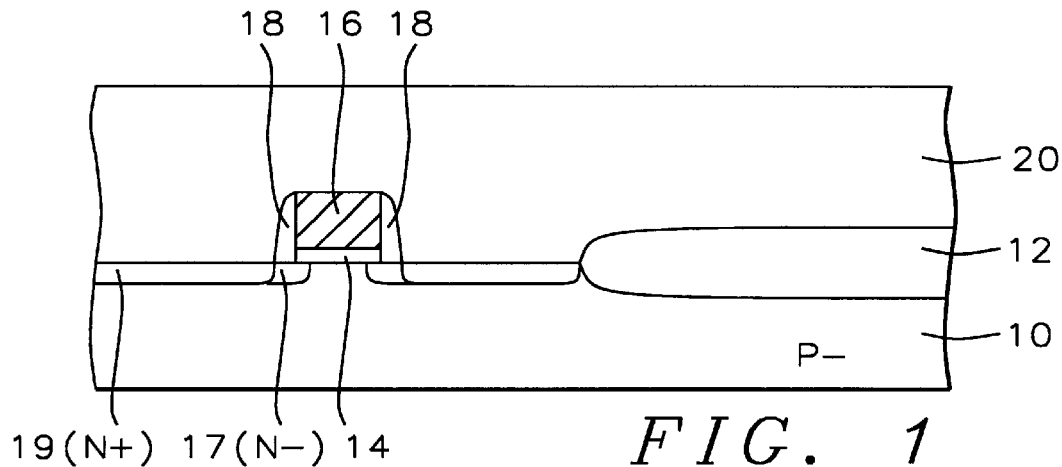
FIGS. 1 through 11 show schematic cross-sectional views for one of the cell regions of an array of DRAM cells illustrating in detail the fabrication steps for making the cactus-shaped stacked storage capacitor by the method of this invention.

Referring now to FIG. 1, a schematic cross-sectional view of a portion of a semiconductor substrate 10 is shown having a partially completed DRAM cell with a pass transistor (N-FET) formed on and in the substrate surface. The preferred substrate 10 is composed of a lightly doped P type single-crystal silicon having a <100> crystallographic orientation. A relatively thick Field OXide (FOX) 12 is formed to surround and electrically isolate the individual device regions in which the memory cells are built. The field oxide 12, which is only partially shown in FIG. 1, is most commonly formed by the LOCal Oxidation of Silicon (LOCOS) method. Briefly the LOCOS method uses a thin $SiO_2$ (pad oxide) as a stress release layer, and a thicker silicon nitride ($Si_3N_4$) layer that serves as an oxidation barrier layer on the pad oxide on the substrate surface (not shown in FIG. 1). Also not depicted in the drawings, conventional photolithographic techniques and etching are used to remove the $Si_3N_4$ barrier layer in areas where a field oxide is required, while retaining the $Si_3N_4$ over the active device areas to prevent oxidation. The silicon substrate is then thermally oxidized to form the field oxide areas 12. The field oxide is usually grown to a thickness of between about 3000 and 6000 Angstroms, and the silicon nitride barrier layer and pad oxide are removed in a wet etch. For example, the nitride can be removed in a hot phosphoric acid ($H_3PO_4$) etch, and the pad oxide can be removed in a dilute solution of hydrofluoric acid and water ($HF/H_2O$). Other field oxide isolation methods can be used which allow even more closely spaced device areas and higher cell density. For example shallow trench isolation (STI) and the like can be used with this invention.

An array of access transistors (N-channel FETs) is now formed in the active device regions, one of which is shown in FIG. 1. The surface of the silicon substrate 10 in the device area is thermally oxidized to form a thin gate oxide 14 for the N-channel FET. The gate oxide 14 is grown to a thickness of between about 30 and 100 Angstroms. An electrically conducting layer 16 which can have a cap oxide (not shown) is deposited and patterned to form the FET gate electrodes 16 over the device areas, and which also form the interconnecting word lines (not shown) over the field oxide for the DRAM cells. Layer 16 is composed of a heavily doped polysilicon layer having a silicide layer such as tungsten silicide ($WSi_2$) to form a polycide. The polycide layer is shown as a single layer 16 in FIG. 1 to simplify the drawing and discussion. The polysilicon layer is deposited by low-pressure chemical vapor deposited (LPCVD) to a preferred thickness of between about 500 and 1500 Angstroms. The polysilicon layer can be conductively doped with arsenic (As) or phosphorus (P) to a concentration of between about 1.0 E 19 and 1.0 E 21 atoms/cm$^3$. The tungsten silicide ($WSi_2$) layer can be deposited by CVD using a reactant gas such as tungsten hexafluoride ($WF_6$) and silane ($SiH_4$). Typically, the $WSi_2$ is deposited to a thickness of between about 500 and 1500 Angstroms, providing a polycide layer having a total thickness of between about 1000 and 3000 Angstroms. If a cap oxide layer is used, it is generally composed of $SiO_2$, and is deposited using LPCVD by decomposing a reactant gas, such as tetraethosiloxane (TEOS). Conventional photolithographic techniques and anisotropic plasma etching are then used to pattern the conducting layer 16 to form the gate electrodes 16, as shown in FIG. 1.

Still referring to FIG. 1, source/drain regions are formed adjacent to the gate electrodes and typically include lightly doped source/drain regions to minimize short-channel effects for sub-half-micron channel FETs. The lightly doped source/drain regions 17(N$^-$) are formed first by ion implantation and are self-aligned to the FET gate electrodes 16. The lightly doped source/drain regions 17(N$^-$) for N-channel FETs, typically used as the access transistor in DRAM cells, are formed by implanting an N type dopant, such as arsenic (As) or phosphorus (P). For example, a typical implant might consist of phosphorus $p^{31}$ at a dose of between about 1 E 13 and 1 E 14 atoms/cm$^2$ and at an energy of between about 20 and 40 KeV. The gate electrodes serve as an implant mask to self-align the lightly doped source/drain regions 17(N$^-$) to the gate electrodes, while an additional patterned photoresist can be used to prevent implantation elsewhere on the substrate where it is not required.

Sidewall spacers 18 are formed on the sidewalls of the gate electrode 16, as shown in FIG. 1. Typically the sidewall spacers 18 are formed by depositing a conformal low-temperature spacer silicon oxide, such as a TEOS oxide, and anisotropically blanket etching back the oxide to the surface of the substrate 10. For example, the spacer oxide can be deposited using LPCVD and a reactant gas such as TEOS/ozone at a temperature in the range of about 650 to 900° C. The etchback is carried out in a reactive ion etcher (RIE) or high-density plasma (HDP) etcher using an etching gas such as trifluoromethane (CHF$_3$). An N$^+$ source/drain ion implantation is then used to complete the source/drain regions forming the N$^+$ doped source/drain contact regions 19(N$^+$) aligned to the sidewall spacers 18, and therefore also aligned to the lightly doped source/drain regions 17, as shown in FIG. 1. This completes the FET, which serves as the access transistor in each of the memory cell areas.

Continuing with FIG. 1, a first insulating layer 20 is deposited over the device areas and the field oxide areas 12. Preferably the first insulating layer is composed of silicon oxide (SiO$_2$). For example, layer 20 can be deposited by low-pressure chemical vapor deposition (LPCVD), and is deposited to a thickness of between about 3000 and 8000 Angstroms. The first insulating layer 20 is then planarized. One method of globally planarizing layer 20 is to use chemical/mechanical polishing (CMP) using an appropriate polishing slurry. Alternatively, a low-temperature glass, such as borophosphosilicate glass (BPSG) can be used as the first insulating layer and locally planarized by thermal annealing.

Figure 2:
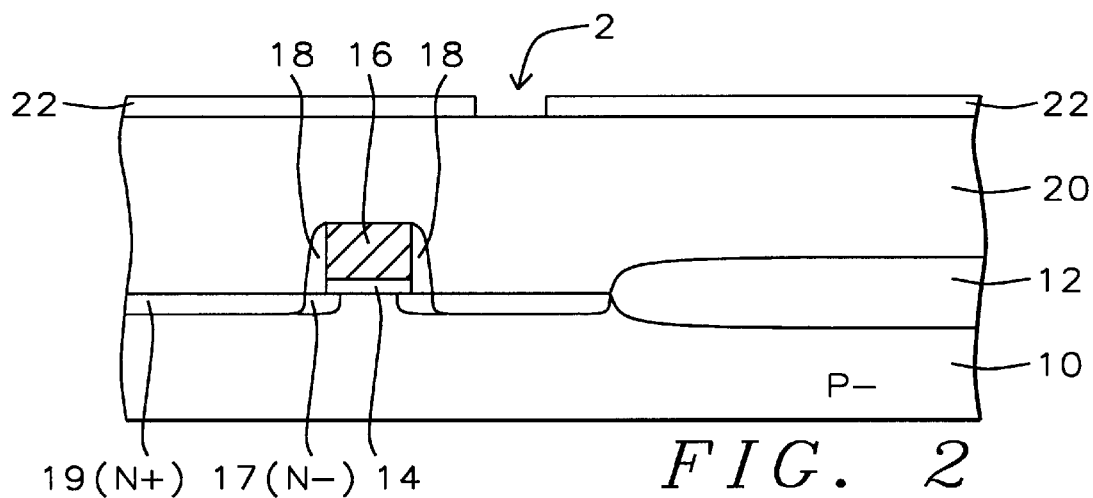

Referring to FIG. 2, a relatively thin second insulating layer 22 is deposited. Layer 22 is preferably composed of silicon nitride (Si$_3$N$_4$) and is deposited by LPCVD using dichlorosilane (SiCl$_2$H$_2$) and ammonia (NH$_3$). Layer 22 is deposited to a preferred thickness of between about 200 and 2000 Angstroms. Conventional photolithographic techniques and plasma etching are used to etch openings 2 in the second insulating layer 22 to the first insulating layer 20. The openings 2 are etched over the source/drain contact areas 19(N$^+$) in the device areas where electrical contacts are desired for the array of cactus-shaped capacitors.

Figure 3:
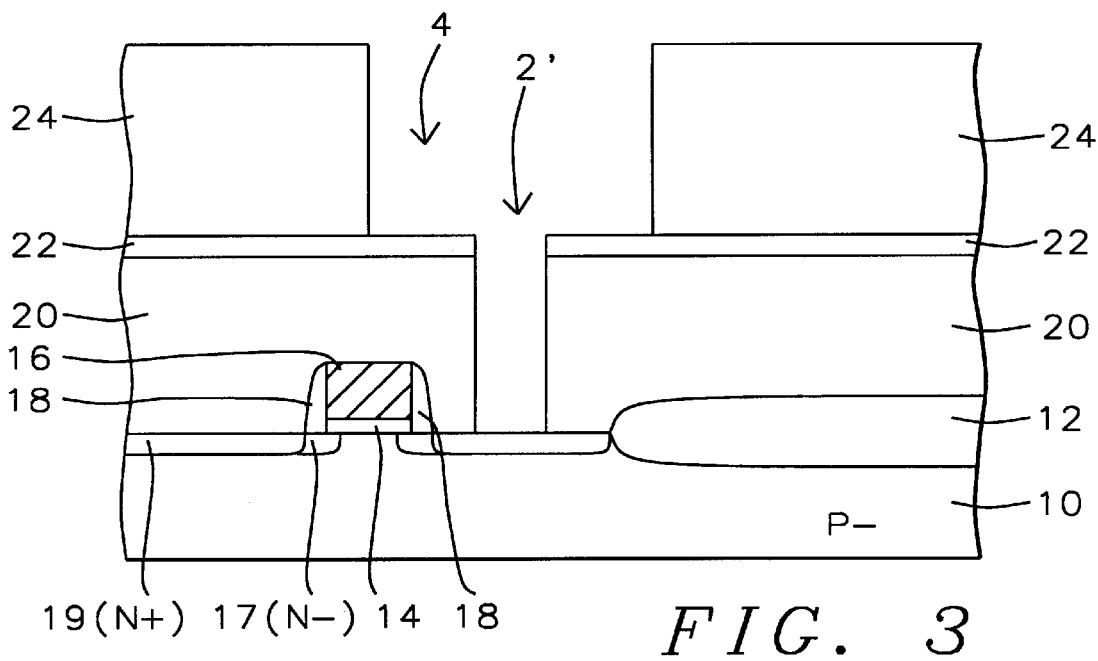

Referring now to FIG. 3, the array of cactus-shaped stacked capacitors, one in each memory cell area, is now formed by depositing a disposable third insulating layer 24 on the Si$_3$N$_4$ second insulating layer 22. The method of forming these capacitors is depicted in FIG. 3 for only one capacitor. Layer 24 is preferably composed of SiO$_2$ deposited by LPCVD using, for example, TEOS/ozone as the reactant gas mixture. Layer 24 is deposited to a preferred thickness of between about 4000 and 12000 Angstroms.

Next, a patterned photoresist mask (not shown) and selective anisotropic plasma etching are used to remove portions of the third insulating layer 24 over the openings 2 in the second insulating layer 22 to form recesses 4 having vertical sidewalls. The anisotropic plasma etching is continued in a single step to etch the contact openings 2' in the first insulating layer 20 to the source/drain contact area 19(N$^+$). The Si$_3$N$_4$ layer 22 having opening 2 serves as an etch-stop layer to form the opening 2' in layer 20. The etching is preferably carried out using high-density plasma (HDP) etching and an etchant gas having a high etch-rate selectivity of SiO$_2$ to Si$_3$N$_4$ that is greater than about 5:1. For example, an etchant gas mixture such as C$_4$F$_8$, CO, O$_2$, and Ar can be used to achieve the high etch-rate selectivity.

Figure 4:
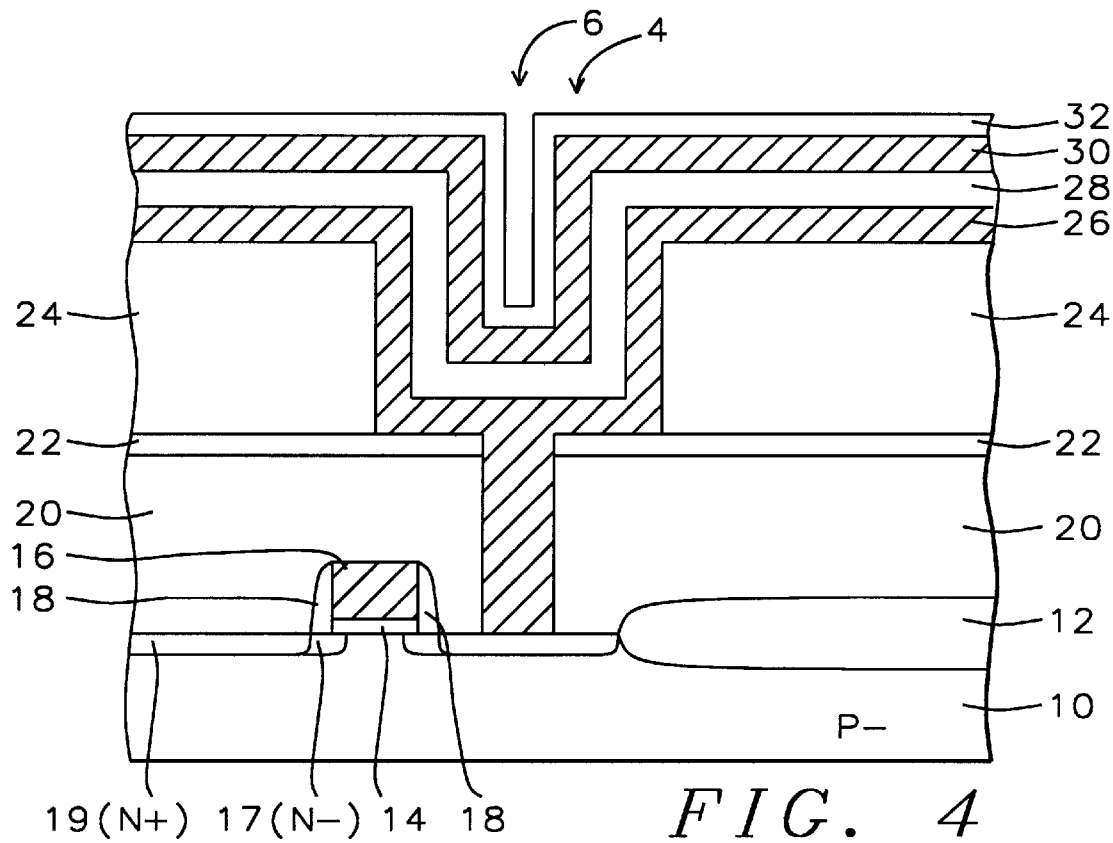

Referring to FIG. 4 and continuing with the process, a conformal conductively doped first polysilicon layer 26 is deposited over the patterned third insulating layer 24 and fills the contact openings 2' in the first insulating layer 20 to make electrical contact with the source/drain device region 19(N$^+$) in each device area, while conformally coating the recess 4. The first polysilicon layer 26 is deposited by LPCVD using, for example, silane (SiH$_4$) as the reactant gas and phosphine (PH$_3$) as the dopant gas. The preferred dopant concentration of layer 26 is between about 1.0 E 19 and 1.0 E 21 atoms/cm$^3$. Layer 26 is deposited to a preferred thickness of between about 500 and 1500 Angstroms.

Still referring to FIG. 4, a series of conformal layers consisting of a fourth insulating layer 28, a second polysilicon layer 30, and a fifth insulating layer 32 is deposited sequentially. A key feature of the invention is to select thicknesses for layers 28, 30, and 32 that maintain a center opening 6 in the recess 4 of the third insulating layer 24. The fourth and fifth insulating layers 28 and 32 are preferably composed of SiO$_2$ and can be deposited by LPCVD using a reactant gas such as TEOS/ozone. Layers 28 and 32 are deposited to a preferred thickness of between about 500 and 1500 Angstroms. The second polysilicon layer 30 is conductively doped in situ during deposition. For example, layer 30 can be deposited by LPCVD using SiH$_4$ as the reactant gas and PH$_3$ as the dopant gas at a preferred dopant concentration of between about 1.0 E 19 and 1.0 E 21 atoms/cm$^3$. Preferably layer 30 is deposited to a thickness of between about 500 and 1500 Angstroms.

Figure 5:
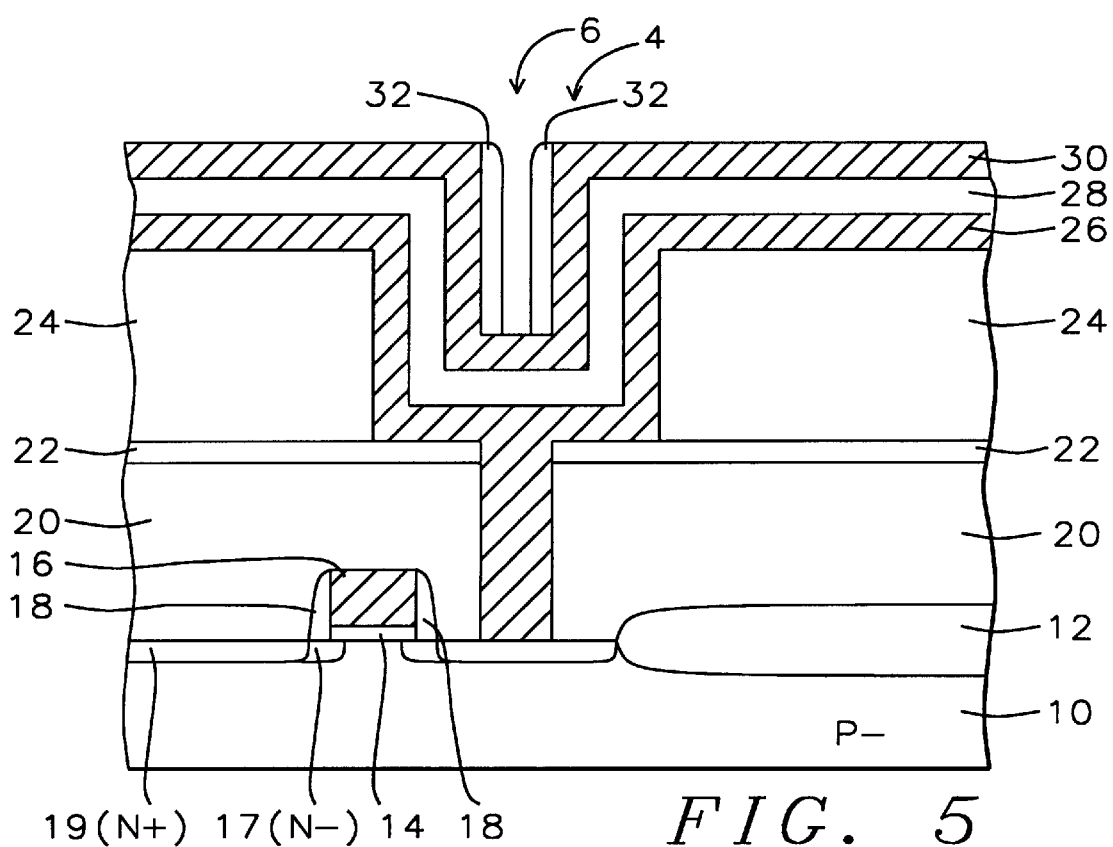

Referring to FIG. 5, the fifth insulating 32 is anisotropically blanket etched back to the second polysilicon layer 30 and is concurrently etched in the bottom of the center opening 6 in each recess 4 while retaining the SiO$_2$ sidewall spacer 32. Preferably the etching is carried out using HDP etching and an etchant gas such as trifluoromethane (CHF$_3$) to provide a high SiO$_2$-to-polysilicon etch rate.

Figure 6:
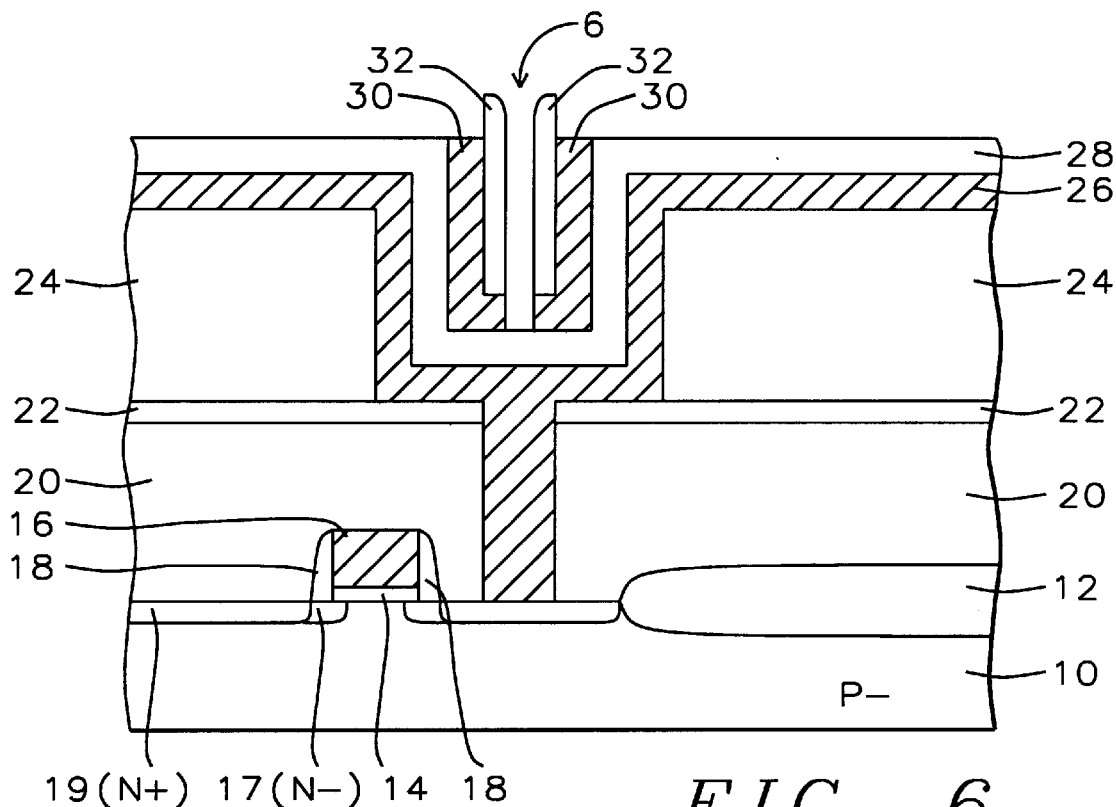

As shown now in FIG. 6, the second polysilicon layer 30 is anisotropically blanket etched back to the fourth insulating layer 28 while concurrently etching the exposed second polysilicon layer 30 in the bottom of the center opening 6 to the surface of the fourth insulating layer 28. The second polysilicon layer 30 is etched preferably using HDP and an etchant gas such as containing chlorine (Cl) species which has a high etch-rate selectivity of polysilicon to SiO$_2$.

Figure 7:
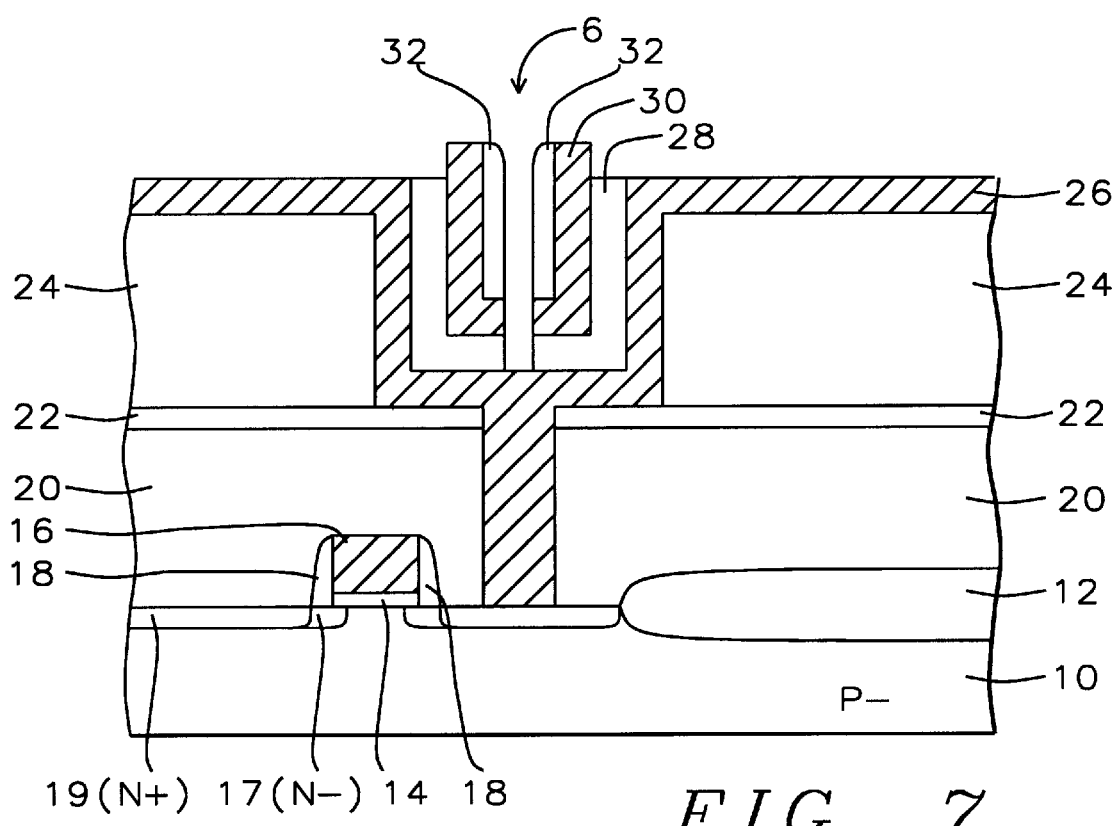

Referring to FIG. 7, the SiO$_2$ fourth insulating layer 28 is anisotropically blanket etched back to the first polysilicon layer 26 and layer 28 exposed in the center opening 6 is also etched to the first polysilicon layer 26. The etching can be carried out, for example, using HDP and an etchant gas such as $CHF_3$.

Figure 8:
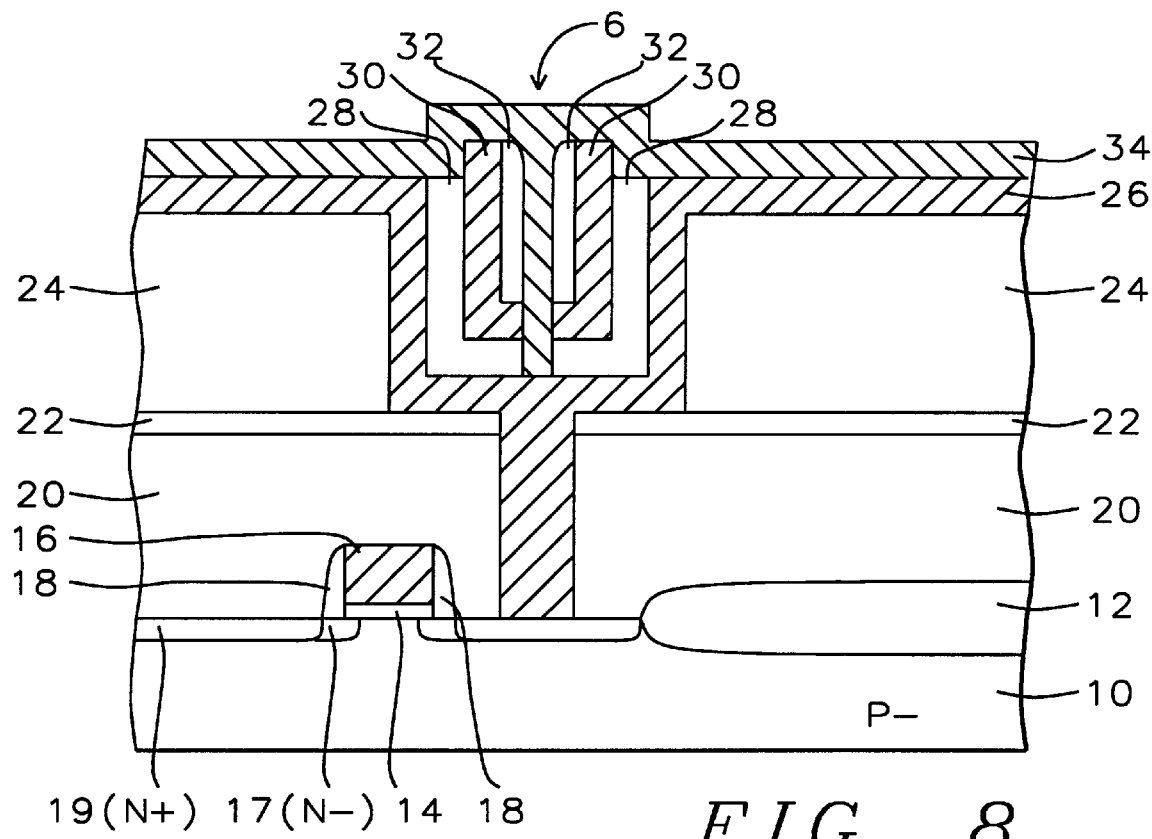

Referring to FIG. 8, after etching back the series of layers 32, 30, and 28, an in-situ conductively doped third polysilicon layer 34 is deposited. Layer 34 is deposited by LPCVD using $SiH_4$ and is doped in situ by adding a dopant gas such as $PH_3$ and is doped to a preferred concentration of between about 1.0 E 19 and 1.0 E 21 atoms/cm$^3$. Layer 34 is deposited to a thickness sufficient to fill completely the center opening 6 to electrically contact the first and second polysilicon layers 26 and 30, respectively, in the center opening 6.

Figure 9:
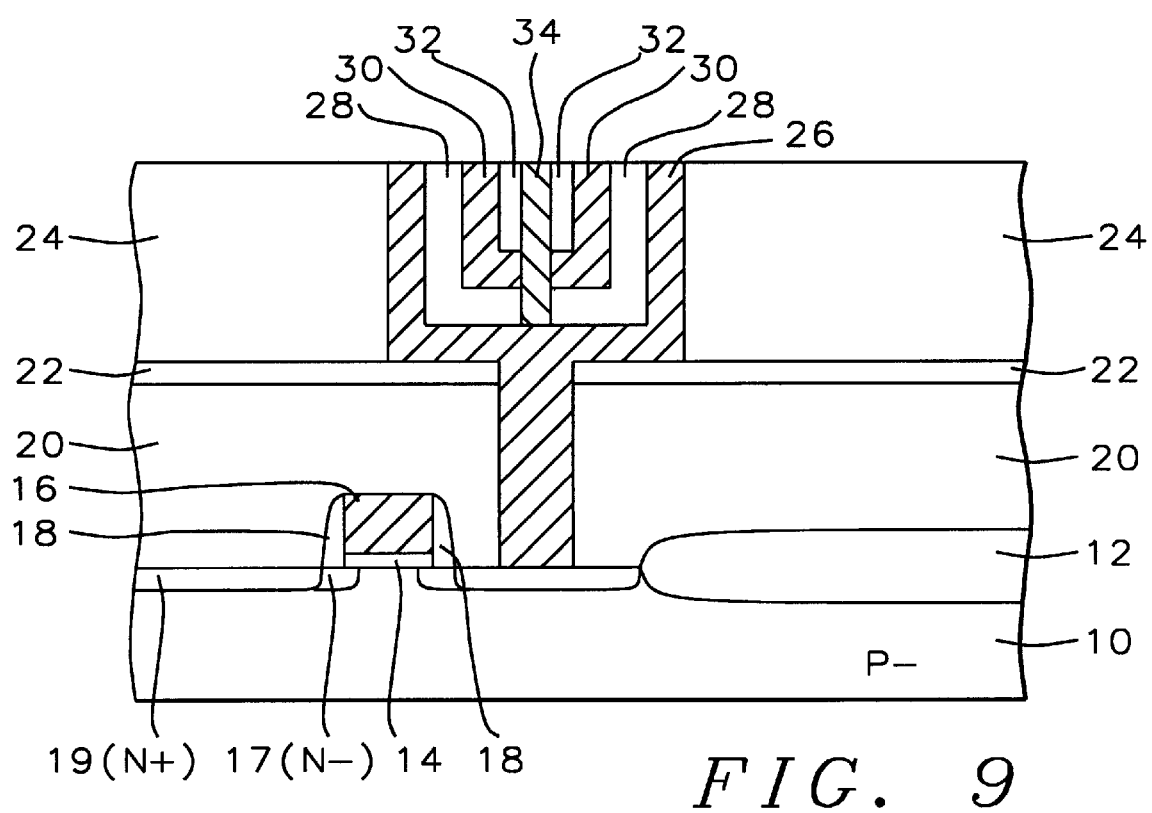

Referring now to FIG. 9, the third polysilicon layer 34, the first polysilicon layer 26, and portions of the second polysilicon layer 30 are chemical/mechanically polished back to the surface of the third insulating layer 24. The remaining portions of the exposed third, fourth, and fifth insulating layers 24, 28, and 32, respectively, are isotropically and selectively removed using a hydrofluoric (HF) acid solution, while the $Si_3N_4$ second insulating layer 22 serves as an etch-stop layer. This results in an array of freestanding bottom electrodes 8 composed of the polysilicon layers 26, 30, and 34 for the cactus-shaped stacked capacitors, one of which is shown in FIG. 10.

Figure 10:
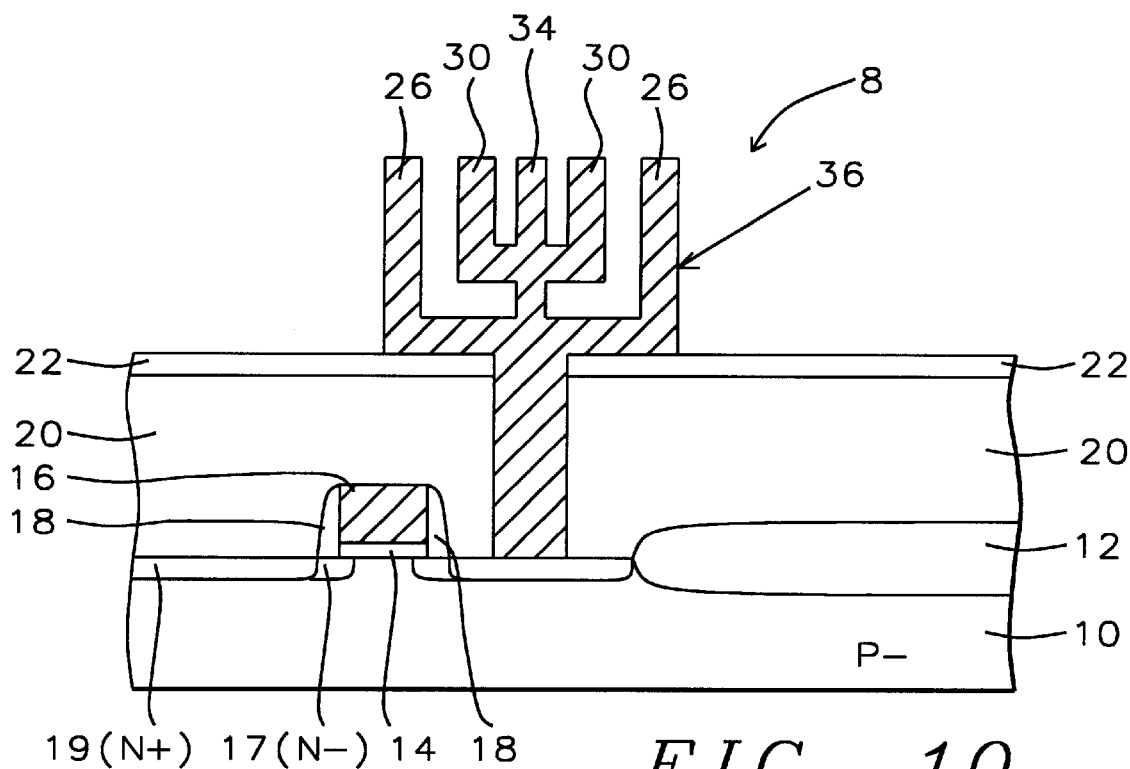
Figure 11:
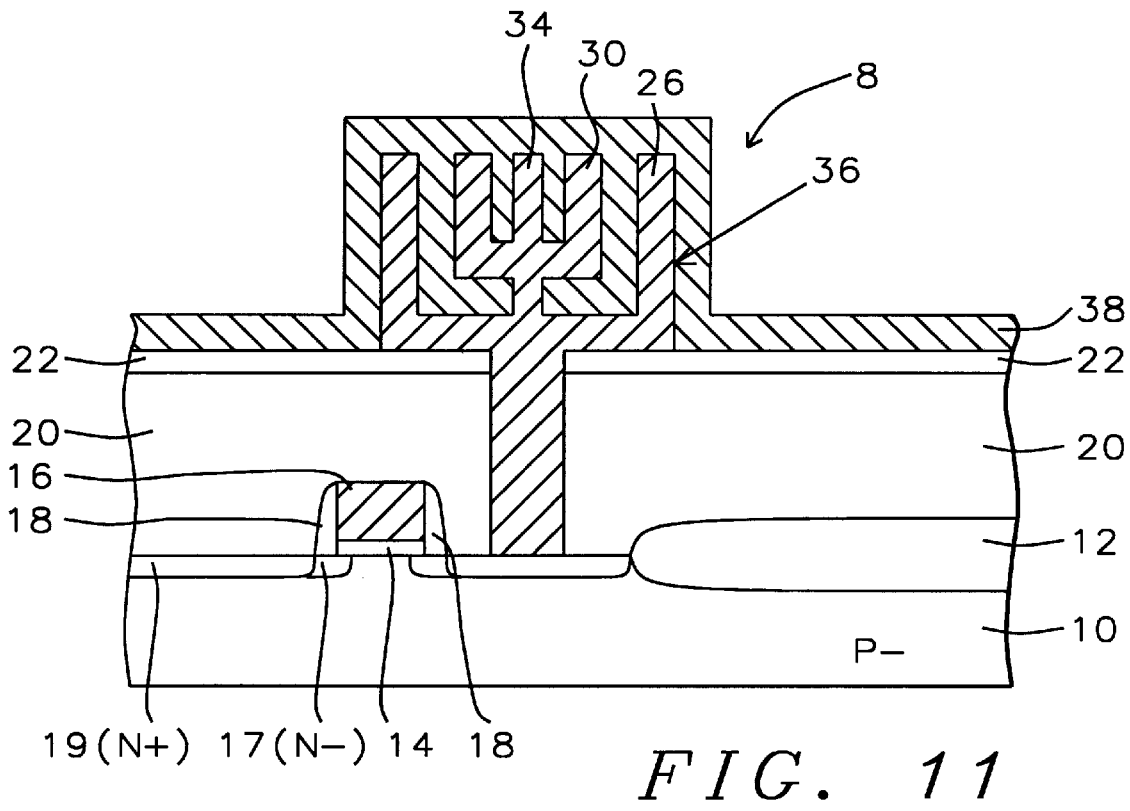

Referring to FIG. 11, the array of capacitors is now completed by forming a thin interelectrode dielectric layer 36 having a high dielectric constant on the surface of the bottom electrode 8 as depicted in FIG. 10. Layer 36 is preferably composed of layers of $SiO_2/Si_3N_4/SiO_2$ (ONO). The ONO dielectric can be formed by growing a thermal oxide on the polysilicon bottom electrodes 8, depositing a $Si_3N_4$ layer by LPCVD, and then using an oxidation furnace to form the top $SiO_2$ by partially reducing the $Si_3N4$ layer. Preferably the ONO is formed having a thickness of between about 30 and 60 Angstroms. Alternatively, layer 36 can be other high-dielectric constant materials, such as tantalum pentoxide ($Ta_2O_5$) or can be used in conjunction with ONO to form the high-dielectric-constant layer 36.

Also shown in FIG. 11, a conformal, in-situ doped fourth polysilicon layer 38 is deposited, for example by LPCVD using a reactant gas such $SiH_4$, and using a dopant gas such as $PH_3$. Layer 38 is doped N$^+$ to a preferred concentration of between about 1.0 E 19 and 1.0 E 21 atoms/cm$^3$. The preferred thickness of layer 38 is between about 500 and 2000 Angstroms. The fourth polysilicon layer 38 is patterned to form the top electrodes 38 to complete the array of dynamic random access memory (DRAM) cells having these novel cactus-shaped stacked capacitors having increased capacitance.

While the invention has been particularly shown and described with reference to the preferred embodiment thereof, it will be understood by those skilled in the art that various changes in form and details may be made without departing from the spirit and scope of the invention.

What is claimed is:

1. A method for fabricating an array of stacked capacitors on dynamic random access memory (DRAM) devices comprising the steps of:

forming field oxide areas on a semiconductor substrate while leaving device areas for fabrication of semiconductor devices;

forming said semiconductor device structures in and on said device areas of said semiconductor substrate;

depositing a first insulating layer over said device areas and said field oxide areas;

planarizing said first insulating layer;

depositing a second insulating layer on said first insulating layer;

forming openings in said second insulating layer to said first insulating layer over said device areas where electrical contacts are desired for said array of stacked capacitors; and forming said stacked capacitors by, depositing a disposable third insulating layer on said second insulating layer;

patterning by photoresist masking and selective anisotropic plasma etching said third insulating layer to said second insulating layer and removing portions of said third insulating layer over said openings to form recesses in said third insulating layer and having vertical sidewalls; and further, selectively etching said first insulating layer exposed in said openings to form contact openings in said second insulating layer to said device areas using said second insulating layer as an etch mask;

depositing a conformal first polysilicon layer over said patterned third insulating layer and filling said contact openings to electrically contact said device areas;

depositing a conformal fourth insulating layer, a second polysilicon layer, and a fifth insulating layer while leaving a center opening at the center of said recesses in said third insulating layer;

anisotropically blanket etching back said fifth insulating layer to said second polysilicon layer and in bottom of said center opening and leaving sidewall spacers on said second polysilicon layer in said center opening;

anisotropically blanket etching back said second polysilicon layer to said fourth insulating layer and in said bottom of said center opening;

anisotropically blanket etching back said fourth insulating layer to said first polysilicon layer and in said bottom of said center opening;

depositing a third polysilicon layer; and chemical/mechanically polishing back said third and said first polysilicon layers to said third insulating layer;

isotropically and selectively removing remaining said third, said fourth, and said fifth insulating layers to form an array of freestanding bottom electrodes for said stacked capacitors;

forming a capacitor dielectric layer on said bottom electrodes;

depositing and patterning a fourth polysilicon layer to form top electrodes thereby completing said array of stacked capacitors for said DRAM devices.

2. The method of claim 1, wherein said first insulating layer is composed of silicon oxide ($SiO_2$) and has a thickness of between about 3000 and 8000 Angstroms.

3. The method of claim 1, wherein said second insulating layer is silicon nitride ($Si_3N_4$) and has a thickness is between about 200 and 2000 Angstroms.

4. The method of claim 1, wherein said third insulating layer is silicon oxide and has a thickness of between about 4000 and 12000 Angstroms.

5. The method of claim 1, wherein said first polysilicon layer has a thickness of between about 500 and 1500 Angstroms.

6. The method of claim 1, wherein said fourth and said fifth insulating layers are silicon oxide and each has a thickness of between about 500 and 1500 Angstroms.

7. The method of claim 1, wherein said second polysilicon layer has a thickness of between about 500 and 1500 Angstroms.

8. The method of claim 1, wherein said third polysilicon layer has a thickness of between about 500 and 1500 Angstroms.

9. The method of claim 1, wherein said third, fourth, and fifth insulating layers are selectively removed in hydrofluoric acid.

10. The method of claim 1, wherein said capacitor dielectric layer is composed of a silicon oxide/silicon nitride/silicon oxide (ONO) having a thickness of between about 30 and 60 Angstroms.

11. The method of claim 1, wherein said fourth polysilicon layer has a thickness of between about 500 and 2000 Angstroms.

12. The method of claim 1, wherein said first, second, third, and fourth polysilicon layers are conductively doped N type with phosphorus.

13. A method for fabricating a dynamic random access memory (DRAM) device having an array of stacked capacitors comprising the steps of:

providing a semiconductor substrate having field oxide areas in and on said substrate surface surrounding and electrically isolating device areas for field effect transistors (FETs);

forming a gate oxide on said device areas;

depositing a polycide layer on said device areas and elsewhere on said field oxide areas;

patterning said polycide layer thereby forming gate electrodes over said device areas and word lines elsewhere over said field oxide areas;

doping by ion implantation said device areas adjacent to said gate electrodes and thereby forming lightly doped source/drain regions;

blanket depositing and anisotropically etching back a sidewall spacer insulating layer and thereby forming sidewall spacers on said gate electrodes;

doping by ion implantation said device areas adjacent to said sidewall spacers forming source/drain contact areas and thereby completing said field effect transistors; and further forming capacitors by, depositing a first insulating layer over said device areas and said field oxide areas;

planarizing said first insulating layer;

depositing a second insulating layer on said first insulating layer;

forming openings in said second insulating layer to said first insulating layer over said device areas where electrical contacts are desired for said array of stacked capacitors; and forming said stacked capacitors by, depositing a disposable third insulating layer on said second insulating layer;

patterning by photoresist masking and selective anisotropic plasma etching said third insulating layer to said second insulating layer and removing portions of said third insulating layer over said openings to form recesses in said third insulating layer and having vertical sidewalls; and further, selectively etching said first insulating layer exposed in said openings to form contact openings in said second insulating layer to one of said source/drain contact areas of each said FET using said second insulating layer as an etch mask;

depositing a conformal first polysilicon layer over said patterned third insulating layer and filling said contact openings to electrically contact said device areas;

depositing a conformal fourth insulating layer, a second polysilicon layer, and a fifth insulating layer while leaving a center opening at the center of said recesses in said third insulating layer;

anisotropically blanket etching back said fifth insulating layer to said second polysilicon layer and in bottom of said center opening and leaving sidewall spacers on said second polysilicon layer in said center opening;

anisotropically blanket etching back said second polysilicon layer to said fourth insulating layer and in said bottom of said center opening;

anisotropically blanket etching back said fourth insulating layer to said first polysilicon layer and in said bottom of said center opening;

depositing a third polysilicon layer; and chemical/mechanically polishing back said third and said first polysilicon layers to said third insulating layer;

isotropically and selectively removing remaining said third, said fourth, and said fifth insulating layers to form an array of freestanding bottom electrodes for said stacked capacitors;

forming a capacitor dielectric layer on said bottom electrodes;

depositing and patterning a fourth polysilicon layer to form top electrodes thereby completing said dynamic random access memory (DRAM) device having said array of stacked capacitors.

14. The method of claim 13, wherein said first insulating layer is composed of silicon oxide ($SiO_2$) and has a thickness of between about 3000 and 8000 Angstroms.

15. The method of claim 13, wherein said second insulating layer is silicon nitride ($Si_3N_4$) and has a thickness is between about 200 and 2000 Angstroms.

16. The method of claim 13, wherein said third insulating layer is silicon oxide and has a thickness of between about 4000 and 12000 Angstroms.

17. The method of claim 13, wherein said first polysilicon layer has a thickness of between about 500 and 1500 Angstroms.

18. The method of claim 13, wherein said fourth and said fifth insulating layers are silicon oxide and each has a thickness of between about 500 and 1500 Angstroms.

19. The method of claim 13, wherein said second polysilicon layer has a thickness of between about 500 and 1500 Angstroms.

20. The method of claim 13, wherein said third polysilicon layer has a thickness of between about 500 and 1500 Angstroms.

21. The method of claim 13, wherein said third, fourth, and fifth insulating layers are selectively removed in hydrofluoric acid.

22. The method of claim 13, wherein said capacitor dielectric layer is composed of a silicon oxide/silicon nitride/silicon oxide (ONO) having a thickness of between about 30 and 60 Angstroms.

23. The method of claim 13, wherein said fourth polysilicon layer has a thickness of between about 500 and 2000 Angstroms.

24. The method of claim 13, wherein said first, second, third, and fourth polysilicon layers are conductively doped N type with phosphorus.

* * * * *